US011374414B2

(12) United States Patent
Wolfgang (10) Patent No.: US 11,374,414 B2
(45) Date of Patent: Jun. 28, 2022

(54) UNINTERRUPTIBLE POWER SUPPLY SYSTEM AND METHOD FOR CONTROLLING THE UNINTERRUPTIBLE POWER SUPPLY SYSTEM AND ASSOCIATED POWER SUPPLY SYSTEM

(71) Applicant: Siemens Aktiengesellschaft, Munich (DE)

(72) Inventor: Paul Wolfgang, Maria Enzersdorf (AT)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 194 days.

(21) Appl. No.: 16/017,364

(22) Filed: Jun. 25, 2018

(65) Prior Publication Data

US 2018/0375346 A1  Dec. 27, 2018

(30) Foreign Application Priority Data

Jun. 26, 2017 (EP) ..................................... 17177934

(51) Int. Cl.
  *H02J 7/00*  (2006.01)
  *H02J 9/06*  (2006.01)
  *G01R 31/3835*  (2019.01)
  *H01M 10/42*  (2006.01)

(52) U.S. Cl.
  CPC ............ *H02J 7/0021* (2013.01); *H02J 7/007* (2013.01); *H02J 9/06* (2013.01); *G01R 31/3835* (2019.01); *H01M 10/4257* (2013.01)

(58) Field of Classification Search
  CPC ................ H02J 9/06; H02J 7/00; G01R 31/36
  See application file for complete search history.

(56) References Cited

U.S. PATENT DOCUMENTS

| 6,104,163 A | * | 8/2000 | Komatsu | ............... H02J 7/0036 |
| | | | | 320/116 |
| 6,184,600 B1 | * | 2/2001 | Asao | ....................... H02K 5/20 |
| | | | | 310/64 |

(Continued)

FOREIGN PATENT DOCUMENTS

| CN | 102593884 | 7/2012 |
| CN | 106464005 | 2/2017 |

(Continued)

OTHER PUBLICATIONS

European Search Report dated Nov. 21, 2017 issued in corresponding European U.S. Appl. No. 17/177,934.

(Continued)

*Primary Examiner* — Rexford N Barnie
*Assistant Examiner* — Elim Ortiz
(74) *Attorney, Agent, or Firm* — Cozen O'Connor (57) ABSTRACT

A method for controlling an uninterruptible power supply system and the uninterruptible power supply system for implementing the method includes a base unit and an accumulator module with a supervision unit, where the base unit includes a charging unit and a control unit for controlling the charging unit and can be accommodated spatially separated from the accumulator module, where a respective current charge-specific state of the accumulator module is established at regular intervals during charging and/or discharging by the supervision unit of the accumulator module and transmitted to the base unit in which the currently transmitted charge-specific state of the accumulator module is evaluated by the control unit and the charging unit of the base unit is controlled accordingly, such that the volume of data transmitted between the base unit and the accumulator module of the uninterruptible power supply unit is significantly reduced and the security of transmission is increased.

16 Claims, 2 Drawing Sheets

(56) References Cited

U.S. PATENT DOCUMENTS

| | | | |
|---|---|---|---|
| 6,184,660 B1 | 2/2001 | Hatular | |
| 10,215,813 B2 | 2/2019 | Mukaitani et al. | |
| 2005/0121979 A1* | 6/2005 | Matsumoto | H01M 10/441 307/66 |
| 2012/0179399 A1 | 7/2012 | Yun et al. | |
| 2013/0082641 A1* | 4/2013 | Nishibayashi | H02J 3/38 320/106 |
| 2013/0130068 A1* | 5/2013 | Song | H01M 10/425 429/50 |
| 2014/0001866 A1 | 1/2014 | Abe et al. | |
| 2015/0108950 A1* | 4/2015 | Yun | H02J 7/0068 320/134 |
| 2015/0180232 A1* | 6/2015 | Mino | H02J 1/08 307/23 |
| 2016/0172901 A1* | 6/2016 | Hsieh | H02J 9/061 307/66 |
| 2017/0063150 A1 | 3/2017 | Sakomoto et al. | |
| 2017/0117587 A1* | 4/2017 | Sugeno | G01R 31/392 |

FOREIGN PATENT DOCUMENTS

| | | |
|---|---|---|
| DE | 19834740 | 2/2000 |
| DE | 102010048188 | 4/2012 |
| JP | 64-71463 B2 | 2/2019 |

OTHER PUBLICATIONS

Office Action dated Jun. 2, 2021 issued in Chinese Patent Application No. 201810667600.1.

* cited by examiner

UNINTERRUPTIBLE POWER SUPPLY SYSTEM AND METHOD FOR CONTROLLING THE UNINTERRUPTIBLE POWER SUPPLY SYSTEM AND ASSOCIATED POWER SUPPLY SYSTEM

BACKGROUND OF THE INVENTION

1. Field of the Invention

The present invention generally relates to uninterruptible power supply systems or UPS systems and, more specifically, to an uninterruptible power supply and a method for controlling the uninterruptible power supply system that comprises at least one base unit and also at least one accumulator module with a supervision unit, where the base unit has at least one charging unit and a control unit for controlling the charging unit and can be accommodated physically separated from the at least one accumulator module.

2. Description of the Related Art

Power supplies, which are fed from a three-phase energy supply network, in particular an alternating current network, and which deliver a direct current output voltage (e.g., 24 Volts DC) to supply the electrical system, are frequently installed in many electrical systems nowadays. In order to insure operation of the electrical system independent of faults and/or outages in the energy supply network, Uninterruptible Power Supply (UPS) systems are usually used. The uninterruptible power supply serves to provide an auxiliary energy supply for the electrical system, in the event of a fault or an outage of the normal energy supply.

An uninterruptible power supply system typically consists of a base unit and one or more accumulator modules, which usually comprise an accumulator for energy storage. An accumulator is a rechargeable store for electrical energy, typically based on an electrochemical system, through which electrical energy is converted during charging into chemical (storage) energy and during discharging is converted back into electrical energy. Accumulator types are usually designated in accordance with the materials used. Known accumulator types are, for example, lithium-ion accumulators, or lead-acid accumulators. The term rechargeable battery or storage battery can also be used as a synonym for the term accumulator, also known as cell for short.

DE 198 34 740 A1 discloses an accumulator module that can additionally include a supervision unit. This supervision unit can serve to supervise the accumulator and can establish and store operating parameters of the accumulator (e.g., accumulator temperature, or accumulator voltage) as well as characteristic accumulator parameters (e.g., end of charge voltage, maximum charge current, temperature dependency of the end of charge voltage, end of discharge voltage, accumulator type, or accumulator size).

The base unit of the uninterruptible power supply which, on the one hand, is connected on the input side to the power supply and on the output side to a load to be supplied, comprises at least one charging unit or a charge regulator and also a control unit. The charging unit or the charge regulator is used to charge the accumulator module or the accumulator modules and also to implement a charging or discharging process. The control unit serves to control the charging unit or the charge regulator. Furthermore, the base unit has a connection unit, through which the at least one accumulator module can be connected to the load, in the event of a fault or an outage of the energy supply network.

In an industrial application of uninterruptible power supplies systems, the base unit and the accumulator module or the accumulator modules can be installed spatially separated from one another. The base unit with charging unit, control unit and connection unit is located in a housing, for example, which is mounted, for example, in a switching cabinet on a top hat rail. The associated accumulator module or the associated accumulator modules, e.g., because of the lower temperature level, can be accommodated on the floor of the switching cabinet or at another location.

Without any faults in the energy supply, electrical energy is passed on by the uninterruptible power supply both to the connected load and also to the at least one associated accumulator module, i.e., the accumulator is charged. When a fault occurs in the energy supply, the at least one accumulator module of the uninterruptible power supply is connected to the load and begins to discharge itself to the load, in order to maintain the electrical energy supply. When the energy supply network returns to its normal state again, the load and the at least one accumulator module are again supplied with electrical energy. That is, with an uninterruptible power supply the at least one accumulator is charged during normal operation of the energy supply network and discharged in the event of a fault.

Different charging methods, which employ different strategies for control of current and voltage, can be used when charging accumulators. In such cases, the charging method used has a significant influence on the performance and the life of the respective accumulator. Often during charging of accumulators frequently used nowadays (e.g. lead-acid accumulators, or lithium-ion accumulators) the so-called IU charging method or Constant Current Constant Voltage method (CCCV method) is used, which connects the "constant current" method with the "constant voltage" method. In this process, in a first phase of the charging process the accumulator is charged with a constant current. In this case, the voltages at the accumulator terminals rise as the charge state increases. When the end of charge voltage is reached at the accumulator there is a change or switchover by the base unit from current to voltage regulation. In the second charging phase, the charging then continues with a constant voltage, where the voltage at the accumulator terminals is held at a constant value. With the increasing charge state of the accumulator, the charge current automatically falls continuously until a predetermined minimum value is reached, which can be included as a criterion for an end of the charging process by the base unit, for example.

However, it must be taken into account in the charging process that a level of the end of charge voltage (in particular with lead-acid accumulators for example) is dependent on a temperature of the accumulator. The end of charge voltage (a characteristic value of the respective accumulator) involves a voltage that is present during the charging process as the terminal voltage at the accumulator terminals. Because of the temperature dependency of the end of charge voltage, the value of the end of charge voltage (=switchover point in the CCCV method) must be adjusted to the accumulator temperature, in order to reach an optimum charge state and at the same time not to adversely affect the life of the respective accumulator by overcharging. That is, a lower accumulator temperature requires a higher end of charge voltage, while a high accumulator temperature requires a lower end of charge voltage.

Similarly, with a discharging process of an accumulator, it is to be insured that a deep discharge (i.e., a consumption of power until the capacity of the accumulator is almost totally exhausted) is avoided, in order to prevent damage to the accumulator. That is, the discharging process, on reaching or falling below an end of discharge voltage (a further characteristic value of the respective accumulator) should be ended by the base unit. The end of discharge voltage is a fixed voltage, down to which the accumulator may be discharged, and depends on the respective accumulator type.

The base unit, in which the control unit and the charging unit for open-loop and closed-loop control of the charging and also discharging process are accommodated, is frequently accommodated spatially separated from the accumulator or the accumulators of the uninterruptible power supply system. In order to guarantee a temperature-dependent adjustment of the end of charge voltage specific to the accumulator used during the charging process, corresponding data (e.g. accumulator parameters, current values of operating parameters such as temperature, or voltage) must be transmitted between the base unit or the associated control unit and the at least one accumulator module of the uninterruptible power supply system or a supervision unit integrated into the accumulator module. In a similar way, during the discharging process, corresponding data (e.g., current values of operating parameters, such as accumulator voltage etc.) must likewise be transmitted between the base unit or the associated control unit and the at least one accumulator module or the associated supervision unit, in order to prevent a deep discharge of the accumulator or of the accumulators.

DE 10 2010 048 188 A1 discloses an accumulator checking facility and associated method for electrical auxiliary supplies in which, for controlling the charging and/or discharging process, current measured values of operating parameters (in particular accumulator temperature and accumulator voltage) are transmitted from the accumulator to a auxiliary supply facility. To achieve this, an accumulator checking facility is connected upstream of the accumulator, which transfers the parameter values required for an optimum charging or discharging process (e.g., accumulator temperature, accumulator voltage, base value of the end of charge or end of discharge voltage, or temperature characteristic of the accumulator) from the accumulator via a bus to the auxiliary supply facility. To this end, the accumulator checking facility has a microcontroller, which controls the measurement, evaluation and transmission of these parameter values. If a number of accumulators are connected to the base unit, then these are connected together via a terminal block, where for transmission of the data of the respective accumulator, each accumulator is allocated its own unique communication address.

In this invention it proves disadvantageous that a relatively large volume of data (such as current measured values, required parameters for an optimum charge or discharge process) is transmitted between the respective accumulator checking facility and the auxiliary supply facility for controlling the respective charge or discharge process. The volume of data must then be evaluated by the auxiliary supply facility (above all when a number of accumulators are used) with a relatively large effort for controlling the charging or discharging process. As well as errors during the transmission of the volume of data over the bus that connects the accumulator checking facility to the auxiliary supply facility, the result can also be errors during the evaluation of the relatively large volume of data in the auxiliary supply facility and thus errors in control during charging and/or discharging of the respective accumulator.

SUMMARY OF THE INVENTION

In view of the foregoing, it is an object of the invention to therefore provide an uninterruptible power supply and a method for controlling the uninterruptible power supply system, via which control of a charging and/or discharging process of accumulators used in the uninterruptible power supply system, in particular when it is spatially separated from a base unit, can be improved in a simple manner and the probability of an error can be reduced.

This and other objects and advantages are achieved in accordance with the invention by an uninterruptible power supply system and method for controlling the uninterruptible power supply system via which method, a respective current charge-specific state of at least one accumulator module is established at regular intervals during a charging process and/or during a discharging process of an at least one accumulator module by a supervision unit of the at least one accumulator module. The respective current charge-specific state of the at least one accumulator module is transmitted to the base unit of the uninterruptible power supply system. There the respective currently transmitted charge-specific state is evaluated by the control unit of the base unit and the charging unit of the base unit is controlled accordingly.

The main aspect of the inventive method consists in being able to control charging and discharging processes of one or more accumulator modules in an uninterruptible power supply system in a simple way and in being able to reduce control errors, which might possibly lead to damage to the accumulator module or modules, as a result. Only the current charge-specific states of the at least one accumulator module (for example, in the form of digital state signals) are transmitted by the inventive method between the supervision unit of the at least one accumulator module and the base unit or associated control unit. A transmission of current measured values of accumulator parameters such as temperature, or voltage can be dispensed with in this case, whereby the susceptibility to errors can be significantly reduced. That is, the physical invention has a significantly smaller volume of data to be transmitted by a reduction in the communication between the at least one accumulator module or associated supervision unit and the base unit of the power supply system, in particular the control unit, such as digital status signals, whereby security of transmission is significantly increased.

Above all, when a number of accumulator modules are used in the uninterruptible power supply system the handling of the data, especially in the control unit of the base unit, becomes significantly simpler. A current charge-specific state is established, for example, in each case by the supervision unit for each accumulator module and transmitted to the control unit in the base unit. There the respective current charge-specific states of the accumulator modules can be logically linked, for example, and in the simplest case the charging unit can be controlled by the control unit so that, e.g., on reaching the end of charge voltage of a first accumulator or on reaching the end of discharge voltage of a first accumulator, the charging process or the discharging process (or the buffering) is ended. By this method, a load on and/or damage to the accumulators used, for example, by overcharging or deep discharging, is prevented in a very simple way.

Ideally, the respective current charge-specific state of the at least one accumulator module is determined by the supervision unit with reference to current measured values of operating parameters of the at least one accumulator module and also on the basis of predetermined accumulator parameters for the at least one accumulator module. For establishing the current charge-specific state, a current temperature and/or a current terminal voltage of the at least one accumulator is measured by the supervision unit as the operating parameter, for example. Furthermore, predetermined, characteristic accumulator parameters are included by the supervision unit for determining the current charge-specific state such as a temperature characteristic of the end of charge voltage of the respective accumulator, type and/or size of the accumulator, end of charge voltage, end of discharge voltage, or maximum level of the charging current. These accumulator parameters can be made available to the supervision unit for example at a time when the system is powered up or can be stored permanently in the supervision unit by the operator or manufacturer of the uninterruptible power supply system.

Furthermore, it is advantageous for the charge-specific states of the at least one accumulator module to be defined as a function of the at least one predetermined, characteristic accumulator parameter for the charging process or for the discharging process. This enables charge-specific states for the charging process to be defined as a function of the end of charge voltage of the respective accumulator, for example. "End of charge voltage not reached", "end of charge voltage reached" and "end of charge voltage exceeded" can be defined as possible charge-specific states for example. In a similar way, charge-specific states can be defined as a function of the end of discharge voltage of the respective accumulator for the discharging process of the at least one accumulator module, such as "end of discharge voltage not reached" and "end of discharge voltage reached".

It is also useful for function states to be additionally defined for the base unit. These function states enable the respective charging process and/or the respective discharging process to be started and/or stopped in a simple manner. To this end for example function states, such as "charging active", "charging inactive", "discharging active", or "discharging inactive" can be defined. These function states can be transmitted to the at least one accumulator module or to the associated supervision unit.

A further, advantageous embodiment of the inventive method makes provision for the current measured values of the operating parameters such as temperature, or terminal voltage, of the at least one accumulator module to be forwarded to the base unit of the uninterruptible power supply system and/or to a checking unit which is higher ranking than the uninterruptible power supply system. The transmitted measured values of the operating parameters can then be included for further evaluations and/or optical displays, on the basis of which a more in-depth assessment of, for example, a readiness for use, or an ageing process of the at least one accumulator module can be performed.

In an advantageous way, the current charge-specific states of the at least one accumulator module and the function states of the base unit are transmitted over a digital interface between the base unit and the at least one accumulator module or the associated supervision unit. The volume of data to be transmitted or the communication between base unit and the at least one accumulator module is thus reduced to a transmission of purely digital status signals. This increases the security of transmission. In particular, when a number of accumulator modules are used, the volume of data to be transmitted and the data handling is significantly simplified by the use of digital status signals and a digital interface.

Furthermore, the current measured values of the operating parameters (e.g., temperature, or terminal voltage) can also be transmitted in a simple way over the digital interface from the supervision unit to the base unit. Here, the operating parameters measured by the supervision unit of the at least one accumulator module, in particular temperature and/or terminal voltage, are digitized and transmitted as digital values. These can be evaluated or displayed optically relatively simply in the base unit or in a higher-ranking checking unit.

In addition to the digital interface, an analog interface between base unit and the at least one accumulator module or the associated supervision unit can be implemented. Via this analog interface the current measured values of the operating parameters (as an alternative or in addition) can be transmitted from the supervision unit to the base unit, in particular the control unit. To achieve this, the current measured values of the operating parameters, in particular the accumulator temperature and/or the terminal voltage, are alternately applied by the supervision unit of the at least one accumulator module as analog voltage values to the analog interface. In the base unit, the voltage values transmitted via the analog interface can be digitized by an analog-digital converter, for example. Furthermore, the base unit will be notified via the digital interface for a correct interpretation as to which operating parameter is currently being transmitted via the analog interface as an analog voltage value.

The object is furthermore achieved by an uninterruptible power supply system for carrying out the inventive method. This uninterruptible power supply system consists of at least one base unit and at least one accumulator module. Here, the base unit comprises at least one charging unit and a control unit, through which the charging unit is primarily controlled for closed-loop control of charge and discharge processes. The at least one accumulator module has a supervision unit and can be accommodated spatially separated from the base unit. Furthermore, the supervision unit of the at least one accumulator module is configured to establish, at regular intervals, a respective current charge-specific state of the at least one accumulator module and transmit it to the base unit. The control unit of the base unit is configured to evaluate the respective currently transmitted charge-specific state of the at least one accumulator module and to control the charging unit accordingly.

The main aspect of the inventive, uninterruptible power supply system likewise consists in reducing a volume of data to be transmitted between the base unit and the accumulator module or the associated supervision unit and to increase the security of transmission. With the inventive, uninterruptible power supply system for a charge and/or discharge process of the at least one accumulator module only the current states for open-loop and closed-loop control are transmitted to the base unit in each case. A transmission of current measured values of the operating parameters (e.g., accumulator temperature, or terminal voltage) is therefore not necessary.

In order to be able to derive the corresponding current charge-specific states, the supervision unit of the at least one accumulator module is ideally configured to measure current values of operating parameters, in particular the accumulator temperature and/or the terminal voltage. To achieve this, the supervision unit can have appropriate sensors for example. From the current measured values of the operating parameters and also based on predetermined accumulator parameters (e.g., end of charge voltage, maximum charging current, temperature dependency of the end of charge voltage, end of discharge voltage, accumulator type, or accumulator size), which are held in the supervision unit, for example, a current, charge-specific state such as "end of charge voltage not reached, "end of charge voltage reached", "end of charge voltage exceeded", "end of discharge voltage not reached", "end of discharge voltage reached" can be established for charging process or discharging process and transmitted to the base unit.

Furthermore, in an advantageous manner, a digital interface is provided for the transmission of the current, charge-specific states to the base unit. The digital interface is further able to be used for a transmission of function states (e.g., "charging active", "charging inactive", "discharging active", or "discharging inactive"), which are able to be defined for the base unit. With the transmission of these function states of the base unit to the supervision unit of the at least one accumulator module, a charge and/or discharge process can be started and/or stopped in a simple manner.

In addition the digital interface can be useful for transmission of current measured values of the operating parameters of the at least one accumulator module. The measured values are thus able to be used for the base unit of the uninterruptible power supply system and/or for a higher-ranking checking unit for more in-depth evaluations and/or optical display, in particular relating to the accumulator functionality.

In addition to the digital interface, an analog interface can also be provided for the inventive, uninterruptible power supply system. As an alternative or in addition, the current measured values of the operating parameters of the at least one accumulator module can be transmitted via the analog interface to the base unit, in the form of voltage values, for example.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention will be explained below by way of examples with reference to the enclosed figures, in which.

DETAILED DESCRIPTION OF THE EXEMPLARY EMBODIMENTS

Figure 1:
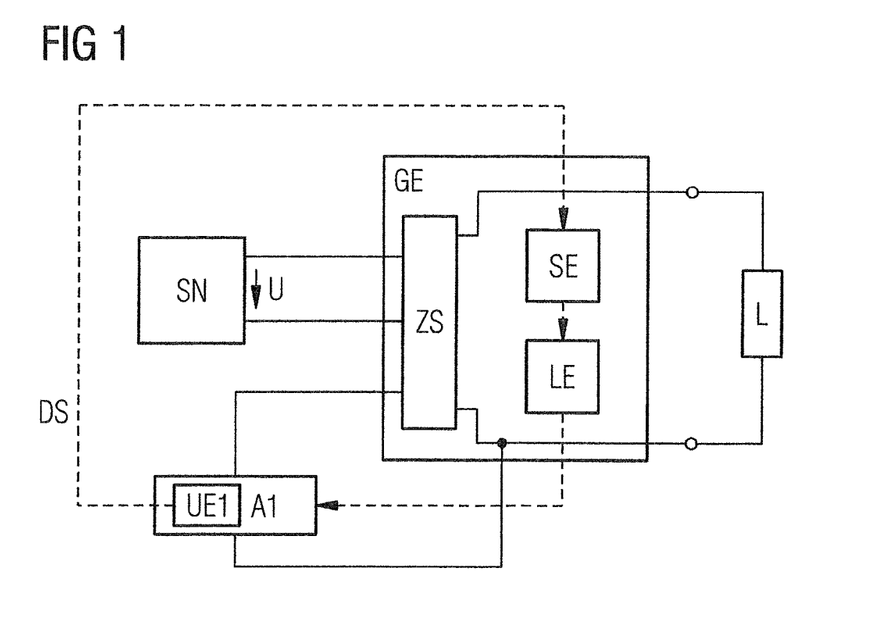
FIG. 1 shows a schematic of an exemplary execution sequence of the for controlling an inventive uninterruptible power supply system in accordance with the invention.

FIG. 1 shows, in a schematic diagram and by way of example, an inventive, uninterruptible power supply system, through which, during an outage of or a fault in the power supply network, in particular an alternating current network, a supply to a load L (e.g., electrical system) can be maintained. The uninterruptible power supply system is connected via a switched-mode power supply SN to the supply network (usually an alternating current network). The switched-mode power supply SN converts a multi-phase AC voltage (mostly a 3-phase AC voltage) into a DC voltage U (e.g., 24 V) at the output of the switched-mode power supply SN.

The uninterruptible power supply system has at least one base unit GE and also at least one accumulator module A1, where the accumulator module A1 is accommodated spatially separated from the base unit GE, but is connected via lines to the base unit GE.

The base unit GE comprises at least one control unit SE and a charging unit LE. The control unit SE can be configured as a microcontroller, for example, and serves to control the charging unit LE. Charging and/or discharging processes of the at least one accumulator module A1 are controlled via the charging unit LE, i.e., the charging unit LE makes sure that a charging current and/or a charging voltage or a discharging current and/or a discharging voltage remain within predetermined limits. The limits for current and voltage, such as a level of the charging current (e.g., maximum/minimum charging current) or permitted end of discharge voltage, can be transmitted at the time at which the power supply system starts up, for example, from the at least one accumulator module A1 to the base unit GE or are set as fixed values by the operator on installation or commissioning.

Furthermore, the base unit GE has a connection unit ZS. In the event of a failure of or a fault in the supply network, there is a switchover by the connection unit ZS for the supply of the load L with the DC voltage U by the at least one accumulator module A1.

The at least one accumulator module A1 has a supervision unit UE1. A small microcontroller can be used, for example, as the supervision unit UE1. The supervision unit UE1 is configured to measure current values of operating parameters, such temperature, or terminal voltage, of the associated accumulator A1. To this end, the supervision unit UE1 can have corresponding sensors, for example. Furthermore accumulator parameters (e.g., end of charge voltage, maximum charging current, temperature dependency of the end of charge voltage, end of discharge voltage, accumulator type, or accumulator size) for the associated accumulator A1 are stored in the supervision unit UE1.

Furthermore, a digital interface DS is provided, via which data is transmitted between the base unit GE or the control unit SE of the base unit GE and the at least one accumulator module A1. Thus, for example, when the uninterruptible power supply system is started up, characteristic accumulator parameters such as maximum charging current, end of discharge voltage, accumulator type, or accumulator size, can be transmitted to the control unit SE of the base unit GE from the supervision unit UE1. The digital interface DS is also able to be used for a transmission of current measured values of the operating parameters of the at least one accumulator module A1, which can then be used for further evaluations and/or optical displays in the base unit GE or in a higher-ranking checking unit.

In addition to the digital interface DS, an analog interface can be provided for a transmission of data, in particular for transmission of measured values of the operating parameters (e.g., temperature, or voltage). The analog interface is not shown in FIG. 1 for reasons of clarity. The current measured values of the operating parameters, in particular the accumulator temperature and/or the terminal voltage, can be saved alternately to the analog interface by the supervision unit UE1 of the at least one accumulator module A1 as analog voltage values. In the base unit GE the voltage values transmitted via the analog interface can be digitized, for example, via an analog-digital converter. In addition thereto the base unit GE must be informed via the digital interface, for a correct interpretation of the measured values, as to which operating parameter is currently being transmitted via the analog interface as analog voltage value.

In the inventive, uninterruptible power supply system charge-specific states are defined for control of a charging process as they are for the control of a discharging process. These charge-specific states depend on at least one predetermined accumulator parameter. Thus, for example, for the charging process of the accumulator module A1, charge-specific states are defined as a function of the end of charge voltage, such as "end of charge voltage not reached", "end of charge voltage reached", or "end of charge voltage exceeded". For the discharging process of the at least one accumulator module A1 the end of discharge voltage is used, for example, for the definition of the charge-specific states and this is defined, for example, as "end of discharge voltage not reached" and "end of discharge voltage reached". These charge-specific states are transmitted via the digital interface DS to the base unit GE or to the associated control unit SE.

Furthermore, function states, such as "charging active", "charging inactive", "discharging active", or "discharging inactive", can likewise be defined for the base unit GE. The respective function states of the base unit GE are transmitted to the at least one accumulator module A1 via the digital interface DS for starting and/or stopping the charging or discharging process. Charging and/or discharging processes of the accumulator module A1 are controlled by an alternating transmission of the function states of the base unit GE and charge-specific states of the at least one accumulator module A1.

A charging process is started, for example, with the transmission of the function state "charging active" from the base unit GE to the accumulator module A1. At the same time, a predetermined constant charging current is set by the control unit SE via the charging unit LE. The level of the charging current is oriented to the accumulator parameters, which have been transmitted, for example, during system startup via the digital interface DS from accumulator module A1 or the associated supervision unit UE1 to the base unit GE or have been determined on installation or commissioning by the operator of the uninterruptible power supply system.

Subsequently, the operating parameters, in particular accumulator temperature and terminal voltage, are measured by the supervision unit UE1 of the at least one accumulator module A1 at regular intervals. The current charge-specific state of the at least one accumulator module A1 is then established by the supervision unit UE1 with reference to the current measured values of the operating parameters and based on accumulator parameters of the at least one accumulator A1. That means that, during the charging process, the current value of accumulator temperature and terminal voltage is compared by the supervision unit UE1 at regular intervals with a temperature-dependent, instantaneously required end of charge voltage, which is also derivable from the accumulator parameters such as a temperature characteristic of the end of charge voltage for accumulator type used. Accordingly, from the possible charge-specific states for the charging process (e.g., "end of charge voltage not reached", or "end of charge voltage reached", "end of charge voltage exceeded") the currently valid charge-specific state is transmitted via the digital interface DS to the control unit SE of the base unit GE.

For a currently transmitted charge-specific state "end of charge voltage not reached", for example, the charging unit LE will be instructed by the control unit SE to continue with the constant current charging of the accumulator A1, i.e., to keep the charging current at the predetermined value. For a currently transmitted charge-specific state "end of charge voltage reached", for example, the charging unit LE will be instructed by the control unit SE to switch from the constant current charging into a constant voltage charging, i.e., the voltage is kept at a constant value. If, on the other hand, for example, the charge-specific state "end of charge voltage exceeded" is signaled, then via control unit SE and via the charging unit LE for the constant voltage charging the end of charge voltage will be reduced step-by-step until such time as the charge-specific state "end of charge voltage reached" is again signaled by the supervision unit UE1 of the at least one accumulator module A1 or the charging falls below a minimum charging current. The charging process is then terminated. Upon terminating the charging process, the function state "charging inactive" is then sent by the base unit GE via the digital interface DS to the at least one accumulator module A1.

For a discharging process of the accumulator A1, e.g., when the accumulator A1 is connected via the connection unit ZS to the load L, in a similar way to the charging process for example, the function state "discharging active" can be sent by the base unit GE to the at least one accumulator module A1 or to the associated supervision unit UE1. Consequently, the operating parameters, in particular the voltage is measured by the supervision unit UE1 of the at least one accumulator module A1 at regular intervals. The current charge-specific state of the at least one accumulator module A is then established by the supervision unit UE1 with reference to the current measured values of the operating parameters and based on predetermined accumulator parameters of the at least one accumulator A1, in particular on the end of discharge voltage of the accumulator A1.

For as long as the charge-specific state "end of discharge voltage not reached" is transmitted to the control unit SE by the supervision unit UE, the discharging process will be continued. If the charge-specific state "end of discharge voltage reached" is sent to the control unit SE by the supervision unit UE1, then the discharging process will be terminated by the base unit GE, in order to prevent a deep discharge of the at least one accumulator module A1. To this end, the function state "discharging inactive" can be transmitted by the base unit GE via the digital interface DS to the at least one accumulator module A1 in order to end the discharging.

FIG. 2, once again as a schematic diagram and by way of example, shows the inventive, uninterruptible power supply system with at least the base unit GE, which has at least the connection unit ZS, the control unit SE and the charging unit LE. Here, however, the uninterruptible power supply system has a number (in FIG. 2, three examples) of parallel-switched accumulator modules A1, A2, A3. Each accumulator module A1, A2, A3 in this case has an associated supervision unit UE1, UE2, UE3 (e.g., microcontroller) integrated, by which the current values of the operating parameters of the respective accumulator module A1, A2, A3 are measured and stored with reference to the accumulator parameters in each case, the current charge-specific states of the respective associated accumulator module A1, A2, A3 can be established at regular intervals.

Figure 2:
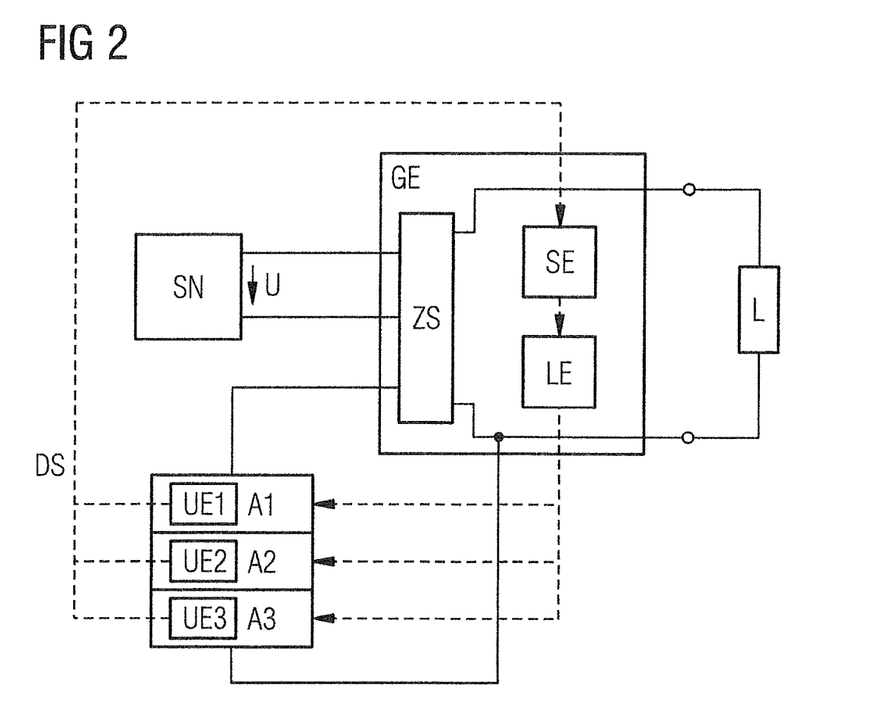
FIG. 2 shows a schematic block diagram of an exemplary uninterruptible power supply system with a number of accumulator modules in accordance with the invention.

The currently established states during a charging and/or discharging process, such as "end of charge voltage not reached", "end of charge voltage reached", "end of charge voltage exceeded", "end of discharge voltage not reached" and "end of discharge voltage reached", for the respective accumulator module A1, A2, A3 are transmitted from the respective associated supervision unit UE1, UE2, UE3 via the digital interface DS to the control unit SE of the base unit GE. The digital interface DS is configured as a serial data interface, for example, which is routed to all accumulator modules A1, A2, A3 or which is used by the supervision units UE1, UE2, UE3 of the accumulator modules A1, A2, A3 to transmit the currently established states to the base unit GE.

The currently transferred charge-specific states are then logically linked within the control unit SE by the respective supervision units UE1, UE2, UE3. From this logical linkage, a corresponding control for the charging unit LE is then established and the charging or discharging process of the accumulator modules A1, A2, A3 is controlled. That is, if, during the discharging process of one of the accumulator modules A1, A2, A3 the charge-specific state "end of discharge voltage reached" is signaled, then the discharging process is terminated for the accumulator modules A1, A2, A3 to prevent a deep discharge. In a similar way, during the charging process for all accumulator modules A1, A2, A3 of the uninterruptible power supply system, which in the constant voltage charging mode reduces the charging voltage step-by-step to the end of charge voltage or ends the charging process, a charge-specific state "end of charge voltage exceeded" is transmitted via the digital interface DS to the base unit GE by at least one accumulator module A1, A2, A3.

The number of accumulator modules A1, A2, A3 able to be used by the uninterruptible power supply system is dependent on a number of communication addresses that can be made available by the digital interface DS used or by the bus for data transmission. The accumulator modules A1, A2, A3 can be distinguished via the respective communication address, so that the charge-specific state or measurement data which has been transmitted from an accumulator module A1, A2, A3 or from an associated supervision unit UE1, UE2, UE3 for further processing is able to be verified.

Figure 3:
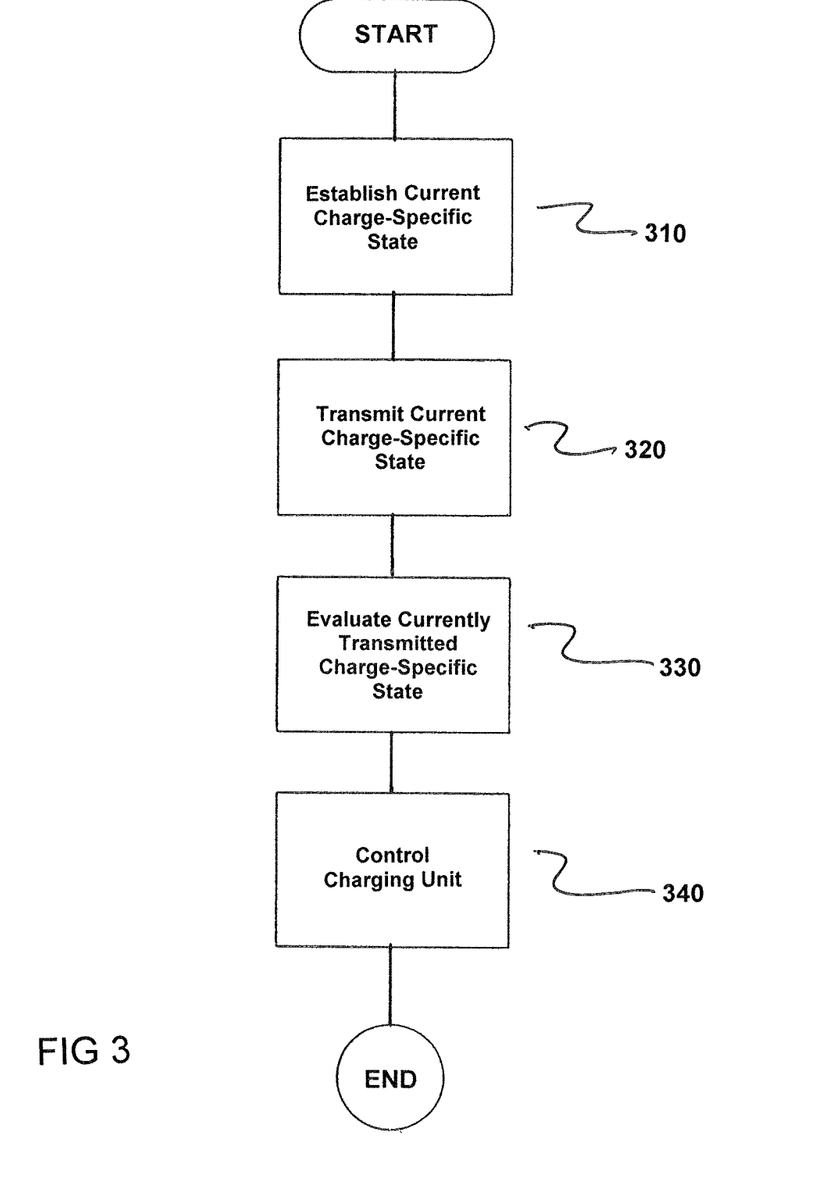
FIG. 3 is a flowchart of the method in accordance with the invention.

FIG. 3 is a flowchart of the method for controlling an uninterruptible power supply system with at least one base unit GE, which comprises at least one charging unit LE and a control unit SSE for controlling the charging unit, and also with at least one accumulator module A1, A2, A3, which has a supervision unit UE1, UE2, UE3, where the base unit GE can be arranged spatially separated from the at least one accumulator module A1, A2, A3. The method comprises establishing a respective current charge-specific state of the at least one accumulator module A1, A2, A3 at regular intervals by the supervision unit UE1, UE2, UE3 of the at least one accumulator module A1, A2, A3, as indicated in step 310.

Next, the respective current charge-specific state of the at least one accumulator module A1, A2, A3 is transmitted to the base unit GE, as indicated in step 320.

Next, the respective currently transmitted charge-specific state is evaluated by the control unit SE of the base unit SE, as indicated in step 330.

The charging unit LE of the base unit GE is controlled based on the evaluated respective currently transmitted charge-specific state, as indicated in step 340.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for controlling an uninterruptible power supply system with at least one base unit, which comprises at least one charging unit, a digital interface and a control unit for controlling the charging unit, and also with at least one accumulator module, which has a supervision unit, wherein the base unit arrangable spatially separated from the at least one accumulator module, the method comprising:

establishing, by the supervision unit comprising a microcontroller including predetermined accumulator parameters, a respective current charge-specific state of the at least one accumulator module at regular intervals;

transmitting, from the supervisor unit comprising the microcontroller, the respective current charge-specific state of the at least one accumulator module to the base unit;

evaluating the respective currently transmitted charge-specific state by the control unit of the base unit; and controlling the charging unit of the base unit based on the evaluated respective currently transmitted charge-specific state;

wherein the at least one accumulator module is directly connected to the digital interface, the control unit and the charging unit of the base unit and is accommodated spatially separated from the base unit.

2. The method as claimed in claim 1, the respective current charge-specific state of the at least one accumulator module is established by the supervisor unit comprising the microcontroller with reference to current measured values of operating parameters and predetermined accumulator parameters for the at least one accumulator module.

3. The method as claimed in claim 2, wherein the operating parameters comprise at least one of temperature and voltage of the at least one accumulator module.

4. The method as claimed in claim 1, wherein the charge-specific states of the at least one accumulator module are defined as a function of at least one predetermined accumulator parameter for at least one of (i) a charging process and (ii) discharging process of the at least one accumulator module.

5. The method as claimed in claim 2, wherein the charge-specific states of the at least one accumulator module are defined as a function of at least one predetermined accumulator parameter for at least one of (i) a charging process and (ii) discharging process of the at least one accumulator module.

6. The method as claimed in claim 1, wherein function states are further defined for the base unit and transmitted to the at least one accumulator module for at least one of (i) starting and (ii) ending at least one of the charging process and discharging process.

7. The method as claimed in claim 1, wherein the current measured values of the operating parameters comprising at least one of (i) temperature and (ii) voltage of the at least one accumulator module are transmitted for at least one of (i) further evaluations and (ii) optical displays to at least one of (i) the base unit and (ii) a higher-ranking checking unit.

8. The method as claimed in claim 1, wherein the current charge-specific states of the at least one accumulator module and the function states of the base unit are transmitted via a digital interface between the base unit and the at least one accumulator module.

9. The method as claimed in claim 1, wherein the current measured values of the operating parameters are additionally transmitted to the base unit via the digital interface.

10. The method as claimed in claim 1, wherein an analog interface is implemented in addition to the digital interface, via which the current measured values of the operating parameters are transmitted to the base unit.

11. An uninterruptible power supply system comprising:
a base unit comprising at least one charging unit, a digital interface and a control unit for controlling the charging unit; and
at least one accumulator module which includes a supervision unit comprising a microcontroller having predetermined accumulator parameters, the at least one accumulator module being directly connected to the digital interface, the control unit and the charging unit of the base unit and being accommodated spatially separated from the base unit;
wherein the supervision unit comprising the microcontroller is configured to establish a respective current charge-specific state of the at least one accumulator module and to transmit said respective current charge-specific state at regular intervals to the base unit; and
wherein the control unit of the base unit is configured to evaluate the respective currently transmitted charge-specific state of the at least one accumulator module and to control the charging unit accordingly.

12. The uninterruptible power supply system as claimed in claim 9, wherein the supervision unit comprising the microcontroller is further configured to measure current values of operating parameters of the at least one accumulator module and, from the measured current values of the operating parameters and also with reference to predetermined accumulator parameters of the at least one accumulator module, is further configured to derive the respective current charge-specific state.

13. The uninterruptible power supply system as claimed in claim 9, further comprising:
a digital interface for transmission of the respective current charge-specific states of the at least one accumulator module and also of function states, which are definable for the base unit, for at least one accumulator module.

14. The uninterruptible power supply system as claimed in claim 10, further comprising:
a digital interface for transmission of the respective current charge-specific states of the at least one accumulator module and also of function states, which are definable for the base unit, for at least one accumulator module.

15. The uninterruptible power supply system as claimed in claim 11, wherein the digital interface is utilizable for a transmission of current measured values of operating parameters of the at least one accumulator module.

16. The uninterruptible power supply system as claimed in claim 11, further comprising:
an analog interface for transmission of current measured values of the operating parameters of the at least one accumulator module in addition to the digital interface.

* * * * *